(12) United States Patent
Chen et al.

(10) Patent No.: US 9,892,920 B1
(45) Date of Patent: Feb. 13, 2018

(54) LOW STRESS BONDING OF SILICON OR GERMANIUM PARTS

(71) Applicant: Lam Research Corporation, Fremont, CA (US)

(72) Inventors: Jihong Chen, Cincinnati, OH (US); Joseph P. Doench, Mason, OH (US); Robert J. Purtell, Eaton, OH (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/399,188

(22) Filed: Jan. 5, 2017

(51) Int. Cl.
- *H01L 21/00* (2006.01)
- *H01L 21/18* (2006.01)
- *H01L 21/324* (2006.01)
- *H01L 23/00* (2006.01)

(52) U.S. Cl.
CPC .......... *H01L 21/185* (2013.01); *H01L 21/324* (2013.01); *H01L 24/83* (2013.01); *H01L 2224/83097* (2013.01); *H01L 2224/83359* (2013.01); *H01L 2224/83379* (2013.01)

(58) Field of Classification Search
None
See application file for complete search history.

(56) References Cited

U.S. PATENT DOCUMENTS

| 2015/0099316 A1* | 4/2015 | Ryu .................. B23K 1/20 438/26 |
| 2017/0040284 A1 | 2/2017 | Chen et al. |
| 2017/0056994 A1 | 3/2017 | Joslin et al. |

OTHER PUBLICATIONS

Hidnert, Peter, "Thermal Expansion of Aluminum and Various Important Aluminum Alloys", Scientific Papers of the Bureau of Standards, vol. 19; pp. 697-731; Washington; Jul. 9, 1924.

Swenson, C.A., "Recommended Values for the Thermal Expansivity of Silicon from 0 to 1000 K", J. Phys. Chem. Ref. Data, vol. 12, No. 2; pp. 179-182. 1983.

* cited by examiner

*Primary Examiner* — Reema Patel

(57) ABSTRACT

A method includes providing a first part, a second part and a bonding material between the first part and the second part. The first part and the second part are made of a first material selected from a group consisting of silicon and germanium. The bonding material includes a second material that is different than the first material. The method includes arranging the first part, the bonding material, and the second part in a furnace; and creating a bonded part by heating the first part, the second part and the bonding material to a predetermined temperature for a predetermined period followed by a predetermined solidification period. The predetermined temperature is greater than 1.5 times a eutectic temperature of an alloy including the first material and the second material and less than a melting temperature of the first material.

20 Claims, 8 Drawing Sheets

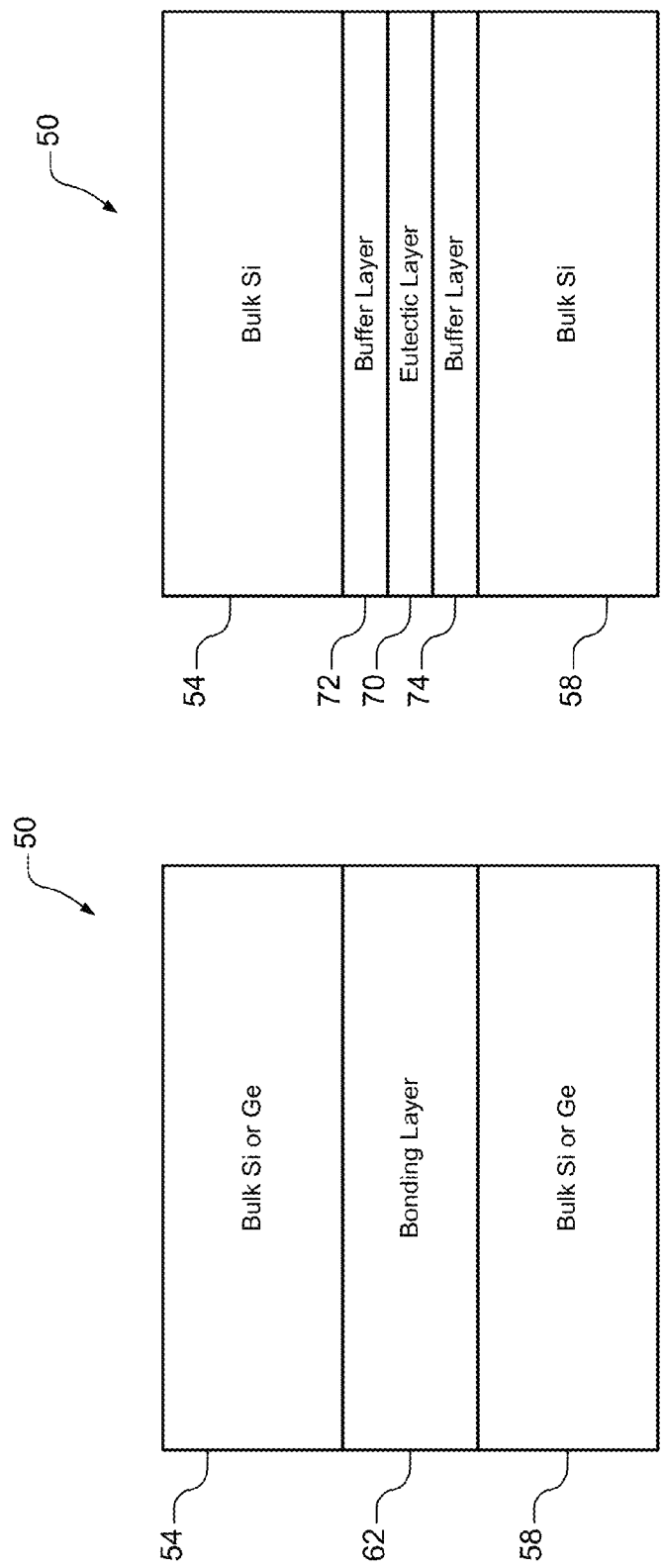

LOW STRESS BONDING OF SILICON OR GERMANIUM PARTS

FIELD

The present disclosure relates to bonded parts made of silicon or germanium and to methods for bonding silicon or germanium parts together.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Semiconductor processing systems may include parts that need to be made of silicon (Si) or germanium (Ge). Large parts that are made using these materials are expensive to manufacture. The cost to produce starting blanks for manufacturing these large parts increases with finished part dimensions. When using silicon, the starting blanks are typically made from single crystal, dislocation free (DF) silicon ingots and multi-crystalline silicon ingots that are sliced to a required thickness.

In many cases, the machining process is time consuming and has high labor cost. Some parts may require large amounts of material to be removed from the starting blank. Some parts (such as a gas distribution plate with an internal plenum) are impossible to make using a monolithic silicon blank. Core drilling and electrical discharge machining (EDM) are effective approaches for reducing material loss and machining time for certain types of parts such as ring-shaped parts. Larger parts can be assembled using two or more smaller parts that are machined separately and then bonded together. This approach can significantly lower manufacturing costs as compared to machining the equivalent part from a single, monolithic blank.

Elastomers have been used to bond silicon to silicon, silicon to graphite, and silicon to aluminum. However, the elastomer bond has relatively weak tensile strength (typically about ~470 psi). The use of elastomer also limits the working temperature to about 185° C. The elastomer bond typically has higher resistivity and lower thermal conductivity than bulk silicon. The elastomer bond is also prone to generate particle contamination in substrate processing systems.

Liquid phase bonding involves arranging a bonding agent such as aluminum or gold between the two or more parts to be bonded together. The bonding agent is heated above its melting temperature. While the bonds are typically strong, the maximum application temperature is limited by the eutectic temperature of Si and the bonding agent, which is 580° C. for Si—Al and 363° C. for Si—Au, which may be too low for some substrate processing system applications. Additionally, the bonding agent may increase metallic contamination and generate non-volatile particles during subsequent use in substrate processing systems. In addition to contamination risk, a coefficient of thermal expansion (CTE) between Si and the bond materials is typically different which can cause shear stress in Si and weaken the bonded part mechanical strength.

SUMMARY

A method for bonding a first part to a second part includes providing the first part, the second part and a bonding material arranged between the first part and the second part. The first part and the second part are made of a first material selected from a group consisting of silicon and germanium. The bonding material includes a second material that is different than the first material. The method includes arranging the first part, the bonding material, and the second part in a furnace; and creating a bonded part by heating the first part, the second part and the bonding material to a predetermined temperature for a predetermined period followed by a predetermined solidification period. The predetermined temperature is greater than 1.5 times a eutectic temperature of an alloy including the first material and the second material and less than a melting temperature of the first material. The bonded part includes a bonding layer including a first buffer layer arranged adjacent to the first part; a eutectic layer that is arranged adjacent to the first buffer layer; and a second buffer layer arranged adjacent to the eutectic layer and the second part. The first buffer layer and the second buffer layer have a higher concentration of the first material than the eutectic layer.

In other features, the first material includes silicon and the bonding material is selected from a group consisting of aluminum, aluminum-silicon alloy, gold, and gold-silicon alloy. The first material includes germanium and the bonding material is selected from a group consisting of aluminum and aluminum-germanium alloy.

In other features, the first buffer layer and the second buffer layer have a first coefficient of thermal expansion (CTE) value that is between a second CTE value of the first part and the second part and a third CTE value of the eutectic layer. A first weight percentage of the second material in the first and second buffer layers is less than one-half of a second weight percentage of the second material in the eutectic layer.

In other features, a weight percentage of aluminum in the first and second buffer layers is <0.01% (by weight) at interfaces between first and second buffer layers and the first and second parts, respectively, and in a range from 80% to 90% (by weight) at interfaces between first and second buffer layers and the eutectic layer.

In other features, the method includes cooling the bonded part at one or more predetermined cooling rates during the predetermined solidification period to a temperature less than the eutectic temperature.

In other features, the method includes heating the first part, the second part and the bonding material at one or more predetermined heating rates during the predetermined period. The method includes controlling a pressure of the furnace to a predetermined pressure, wherein the predetermined pressure is less than 1 Torr. The method includes pressing the first part, the second part and the bonding material together using an external compressive force in a range from 0 psi to 5 psi during bonding.

In other features, the predetermined period at the predetermined temperature is in a range from 30 minutes to 300 minutes. The bonding layer has a Si concentration in a range from 45 to 80% by weight. The eutectic layer has a thickness in a range from 5 to 30 micrometers.

A bonded component includes first and second parts made of a first material selected from a group consisting of silicon and germanium. A bonding layer includes a first buffer layer arranged adjacent to the first part; a eutectic layer that is arranged adjacent to the first buffer layer; and a second buffer layer arranged adjacent to the eutectic layer and the second part. The bonding layer includes a second material that is different than the first material. The first buffer layer and the second buffer layer have a higher concentration of the first material than the eutectic layer.

In other features, a concentration by weight of the first material in the first buffer layer decreases as a distance from an interface between the first buffer layer and the first part increases in a direction towards the eutectic layer.

In other features, the first material includes germanium and the second layer includes germanium and aluminum. The first material includes silicon and the bonding layer includes silicon and a material selected from a group consisting of aluminum and gold.

In other features, the first buffer layer and the second buffer layer have a first coefficient of thermal expansion (CTE) value that is between a second CTE value of the first part and the second part and a third CTE value of the eutectic layer. A first weight percentage of the second material in the first and second buffer layers is less than one-half of a second weight percentage of the second material in the eutectic layer. A weight percentage of aluminum in the first and second buffer layers is <0.01% (by weight) at interfaces between first and second buffer layers and the first and second parts, respectively, and in a range from 80% to 90% (by weight) at interfaces between first and second buffer layers and the eutectic layer.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 1 is a side cross-sectional view of an example of first and second parts and a bonding material therebetween prior to heating in a furnace according to the present disclosure;

FIG. 2 is a side cross-sectional view of an example of first and second parts, buffer layers and a eutectic layer after bonding in the furnace according to the present disclosure;

In the drawings, reference numbers may be reused to identify similar and/or identical elements.

DETAILED DESCRIPTION

Figure 3:
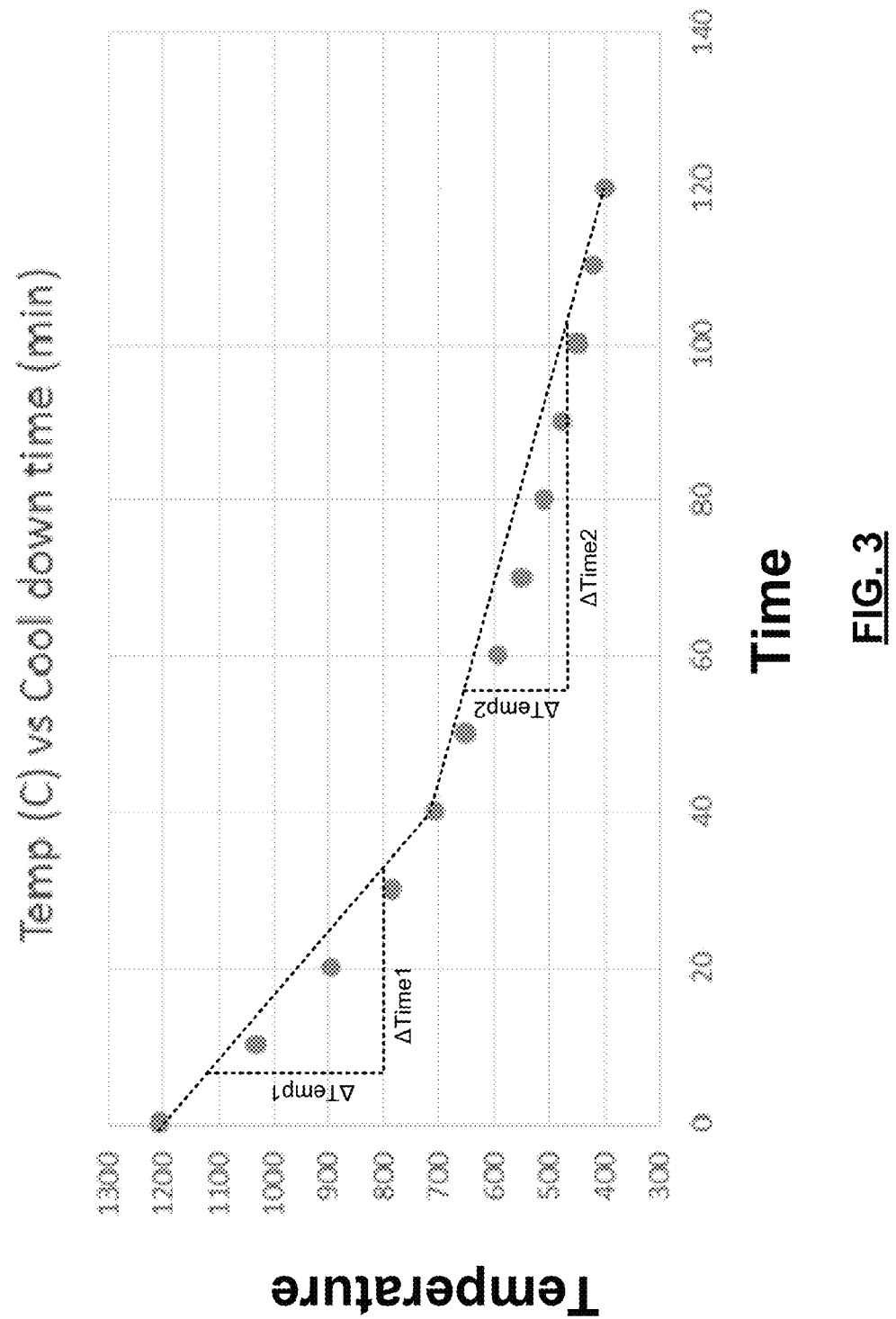
FIG. 3 is a graph illustrating an example of temperature as a function of time during cooling of the bonded part.

Referring now to FIG. 1, a part 50 that is to be bonded together includes a first part 54 and a second part 58. In some examples, the first part 54 and the second part 58 are made of a material selected from a group consisting of silicon (Si) or germanium (Ge). The first part 54 and the second part 58 may be bonded together using bonding material 62 to create a bonded part. In some examples, the first and second parts 54, 58 are made of Si and the bonding material 62 includes aluminum (Al), Al—Si alloy, gold (Au), or Au—Si alloy. In some examples, the first and second parts 54, 58 are made of Ge and the bonding material 62 includes aluminum (Al) or Al—Ge alloy.

The bonding material 62 is arranged between the first part 54 and the second part 58. The first part 54 and the second part 58 and the bonding material 62 are heated to a predetermined temperature in a furnace, maintained at the temperature for a predetermined period and then cooled during a predetermined solidification period.

For example, when heating Si parts and an Al—Si bonding material to temperatures between 700° C. to 850° C., which is close to the Al—Si eutectic point, the Al—Si bond has a relatively low Si concentration and little buffer between Al—Si eutectic layer and bulk silicon. This bonding condition and bond structure lead to higher stress in the bonded part, which can cause cracks in downstream machining processes. Micro-cracks adjacent to the Al—Si bond form in the bond cross-section even with bond thicknesses as thin as 5-10 um. The cracks occur due to differences in a coefficient of thermal expansion (CTE) of the first and second parts as compared to the CTE of the bonding material 62. In addition, the wettability of the Al or Al—Si alloy melted at lower temperatures (700 C-850 C) is low, which can lead to bead formation. Al beads stress the silicon underneath and may cause cracks in the downstream machining process.

Referring now to FIG. 2, the method for creating a bonded part according to the present disclosure uses higher temperatures to increase Si or Ge concentration in the molten layer by melt back the first and second parts 54 and 58. During solidification, buffer layers 72 and 74 are first formed on the first and second parts 54 and 58 followed by a eutectic layer 70 at the eutectic temperature. The buffer layers 72 and 74 have lower Al or Au concentration and a transient CTE value between the CTE of the first and second parts 54, 58 and the CTE of the eutectic layer 70. These buffer layers reduce stress induced by CTE mismatch.

In some examples the concentration of Si in the buffer layers 72 and 74 is in a range from 45-80% weight (as compared to Si eutectic concentration in Al—Si bonds of 12.6% weight). In some examples, the thickness of the eutectic layer 70 is between 5 and 30 micrometers thick.

In some examples, the buffer layers 72 and 74 include a relatively smaller amount of Al or Au. In some examples, the Al or Au concentration in the buffer layers 72 and 74 is significantly less (in some examples, an order of magnitude less) than the Al or Au concentration in the eutectic layer 70. In some examples, the Al concentration in the buffer layers 72 and 74 is ~0% at the interfaces between 54 and 72 and between 58 and 74 and in a range from 80% to 90% (e.g. ~87%) at the interfaces between the eutectic layer 70 and the buffer layers 72 and 74. The Al concentration profile in the buffer 72 and 74 can be linear or non-linear.

The eutectic layer 70 is located between the buffer layers 72 and 74. The buffer layers 72 and 74 provide a transition material separating the first part 54 and the second part 58 from the eutectic layer 70, respectively. The buffer layers 72 and 74 are more like Si or Ge in terms of crystal structure, orientation and composition than the eutectic layer 70. In some examples, the CTE of the buffer layers 72 and 74 has a value between the CTE of the first and second parts 54, 58 and the CTE of the eutectic layer 70. The buffer layers 72 and 74 reduce stress in the bonded part.

In some examples, the bonding material (such as ribbon or wire) is positioned between surfaces of the first part 54 and the second part 58. In some examples, the first part 54 and the second part 58 are pressed together with external compressive force. In some examples, the external compressive force is normal and is in a range from 0 psi to 5 psi, although higher pressures can be used. In some examples, a variable compressive force is used during bonding.

In some examples, the parts 54 and 58 are heated in a furnace to a predetermined temperature at a predetermined pressure for a predetermined period. In some examples, the predetermined temperature is greater than or equal to 1.6 times a eutectic temperature of the alloy including the parts (Si or Ge) and the material in the bonding material and less than a melting temperature of the material of the parts (Si or Ge). For example, silicon has a melting temperature of 1414° C. and germanium has a melting temperature of 938° C.

For example for silicon parts using an Al—Si alloy as the bonding material, the predetermined temperature may be in a range from 1000° C. to 1300° C. (the eutectic temperature is 577° C.). In contrast, the eutectic temperature for Al—Ge is 420° C. and the eutectic temperature for Au—Si alloy is 360° C. In some examples, the predetermined pressure is vacuum, e.g. pressure <1 Torr. In some examples, the predetermined period at the high temperature is in a range from 30 minutes to 300 minutes.

During the extended period of soaking at high temperatures, Si or Ge concentration increases in the alloy melt and then levels off to an equilibrium concentration at the bonding temperature. For example for silicon parts, the equilibrium concentration is about 67% by weight at 1200° C. The increased Si concentration is supplied by melting Si at the bonding surfaces. During cool down, Si with small amount of Al (0.01% to ~3% concentration by weight) is regrown (epitaxially) on the Si mating surfaces until 577° C. (the eutectic temperature). At 577° C., the remaining melt solidifies as the eutectic layer 70, which has 12.6% weight silicon. The thickness of the low stress Al—Si bond is controlled by the amount of Al alloy, the highest temperature, soaking time and cool down rate. The buffer layers 72 and 74 have a higher concentration of the part material (Si or Ge) than the eutectic layer 70. In some examples, the concentration is 5 times higher in the buffer layers 72 and 74 as compared to the eutectic layer 70 for Si—Al—Si bond.

In some examples, a furnace is used to heat the first part 54, the second part 58 and the bonding material 62 to create the bonded part. In some examples, the furnace includes side, top, and bottom thermal insulation material surrounding side, top and bottom heaters. The furnace can have a cylindrical, cubical or other shape.

Figure 4:
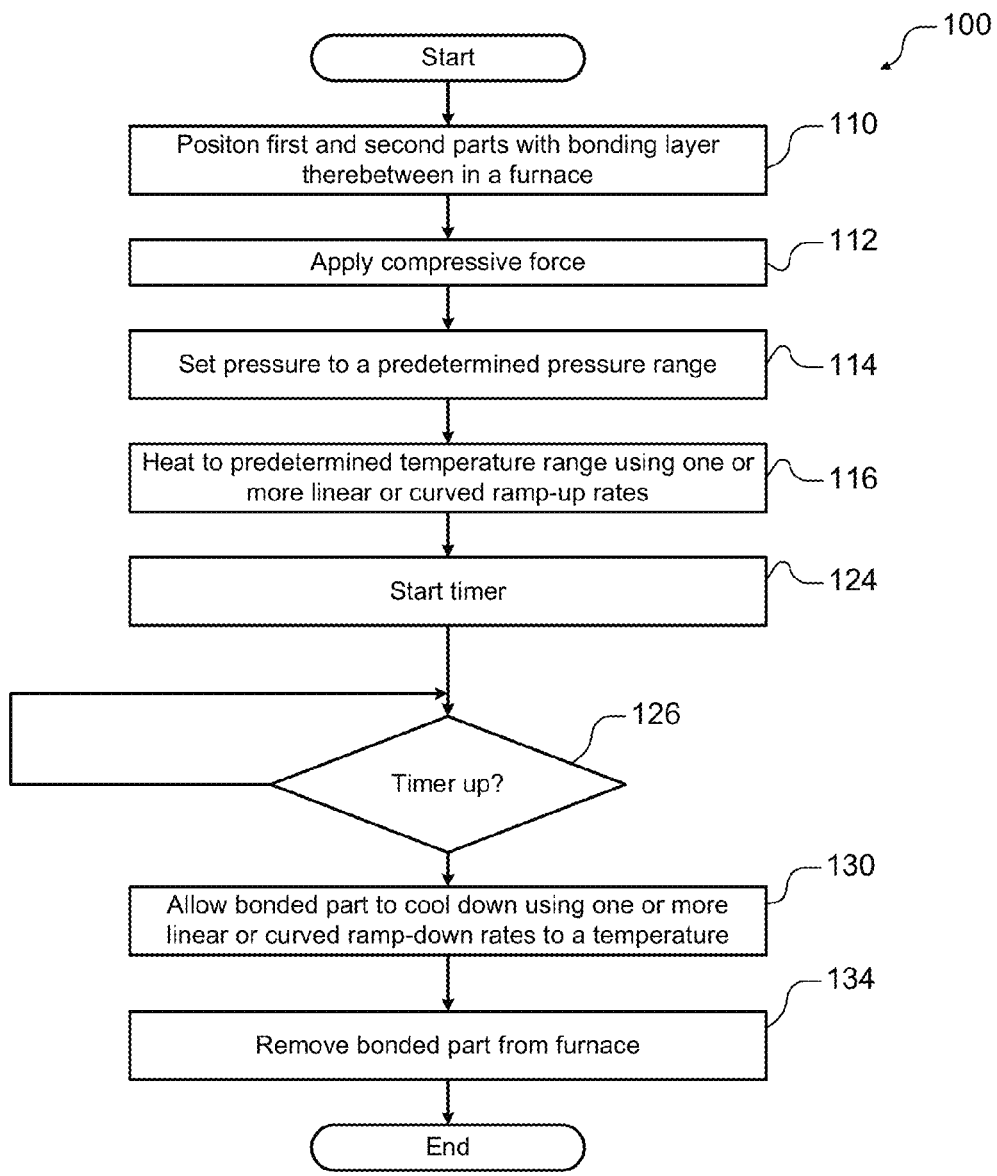
FIG. 4 is a flowchart illustrating an example of a method for bonding the first and second parts with the bonding material therebetween to create the buffer layers and the eutectic layer according to the present disclosure.

Referring now to FIG. 4, a method 100 for bonding a first part to a second part in a furnace is shown. At 110, a bonding material is arranged between the first part and the second part in the furnace. At 112, a compressive force may be applied or the weight of the parts may be used. At 114, pressure in the furnace is optionally set to a predetermined pressure. At 116, the furnace is heated to a predetermined temperature range. In some examples, the temperature in the furnace is increased using one or more linear or curved temperature ramp-up rates during corresponding periods.

At 124, a timer is started either when the parts are arranged in the furnace or when the furnace reaches the pre-determined temperature. When the timer is up as determined at 126, the bond solidification occurs by cooling at 130. In some examples, the cooling is performed using one or more linear or curved temperature cool-down rates during corresponding periods. When the cooling period is up or a predetermined temperature is reached, the bonded part can be removed from the furnace at 134 or the bonded part can remain in the furnace until it reaches ambient or another temperature.

Figure 5:
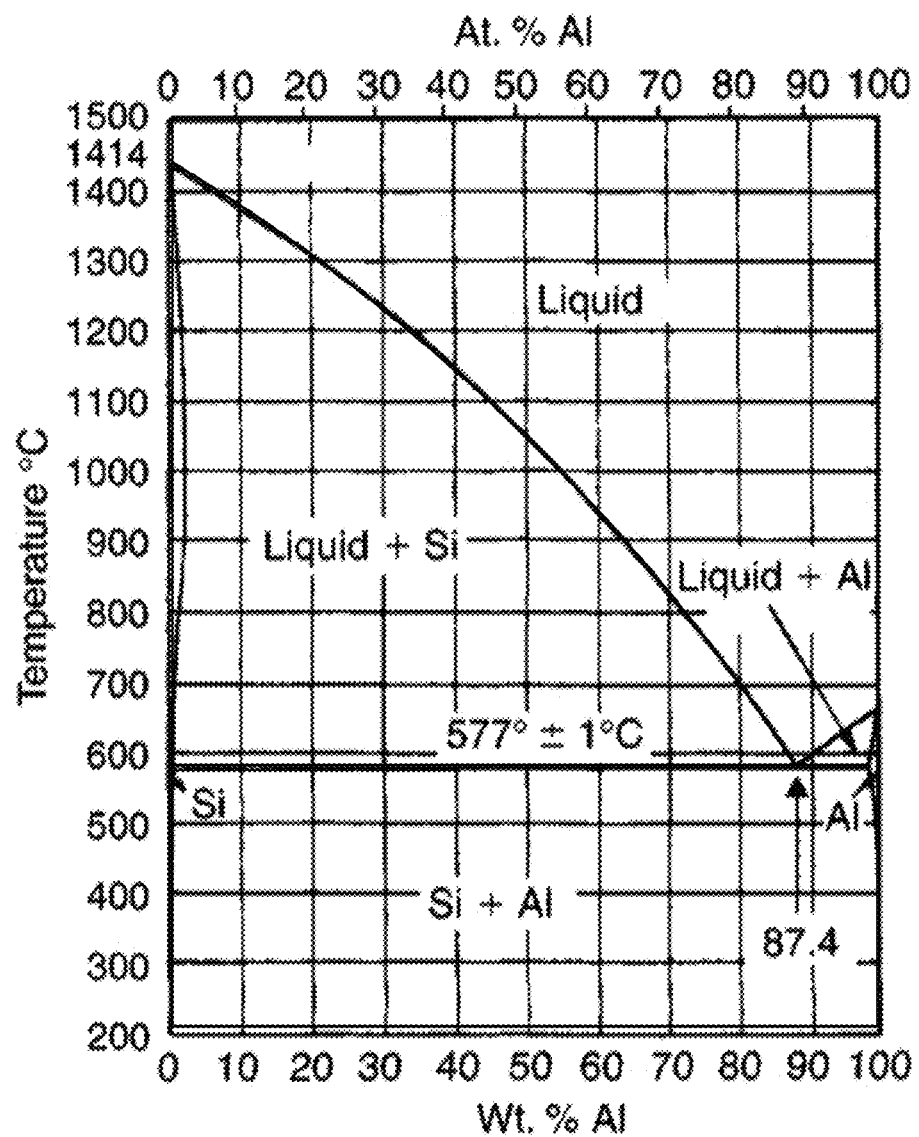
FIGS. 5, 6 and 7 are phase diagrams for Al—Si, Au—Si and Al—Ge.
Figure 6:
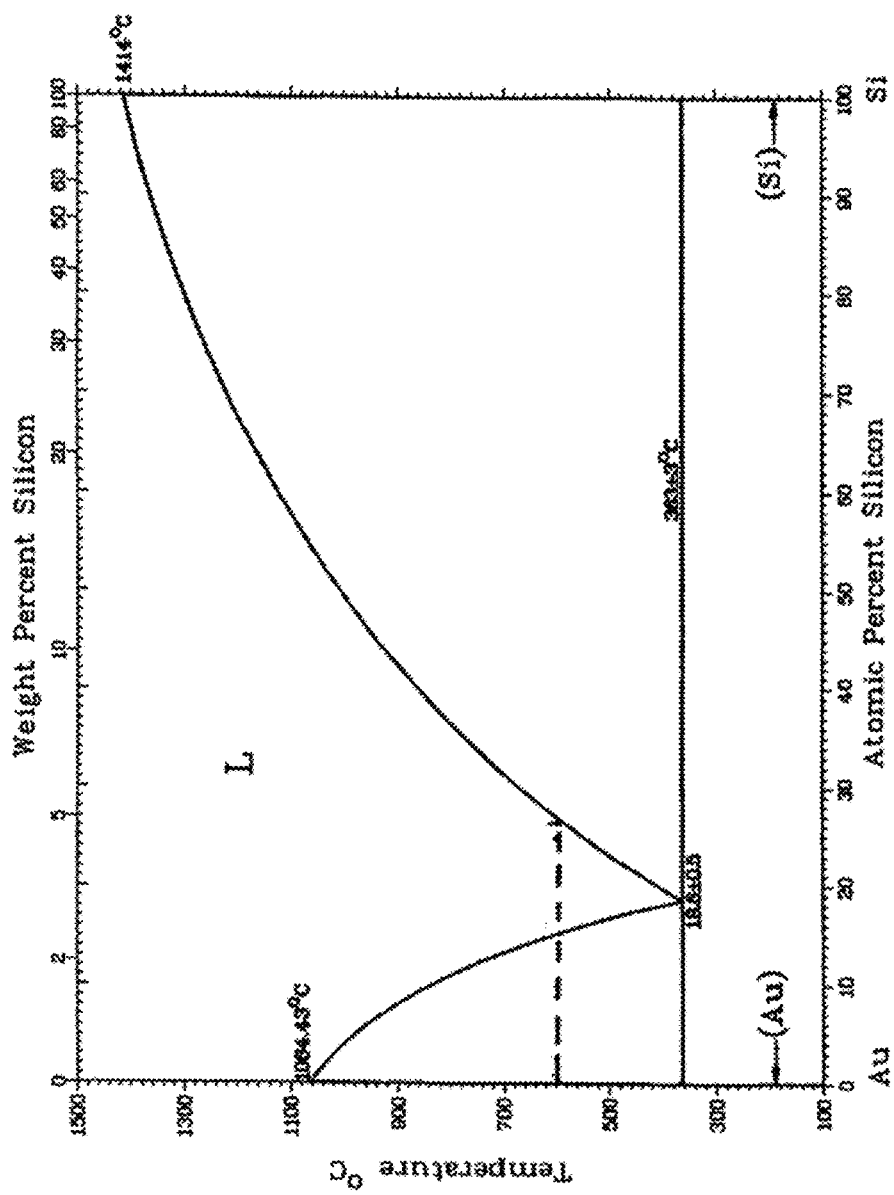
Figure 7:
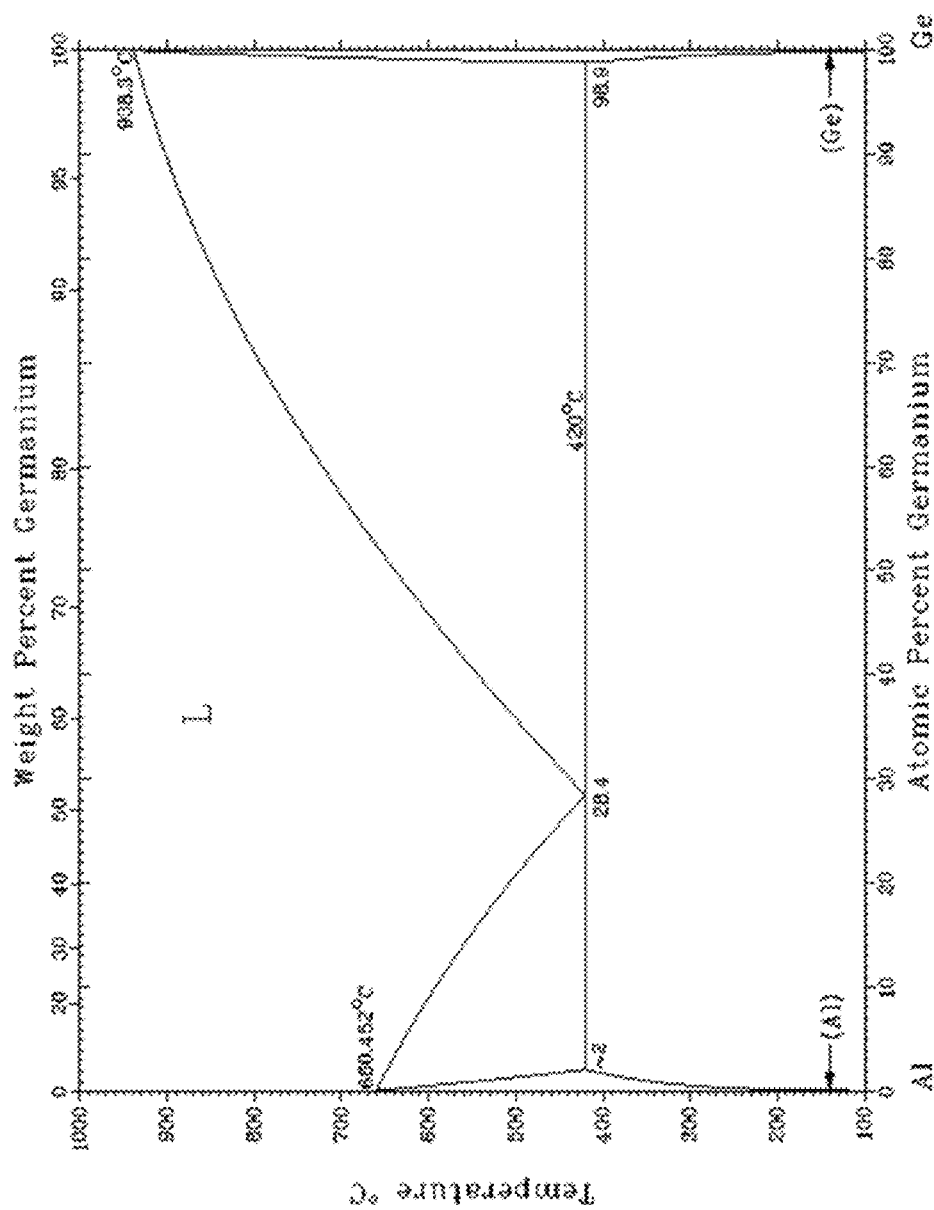

Referring now to FIGS. 5-7, examples of phase diagrams are shown. In FIG. 5, the phase diagram for Al—Si is shown. In FIG. 5, the phase diagram for Al—Si is shown. In FIG. 6, the phase diagram for Au—Si is shown. In FIG. 7, the phase diagram for Al—Ge is shown. The eutectic temperatures are located at minima as shown.

Figure 8:
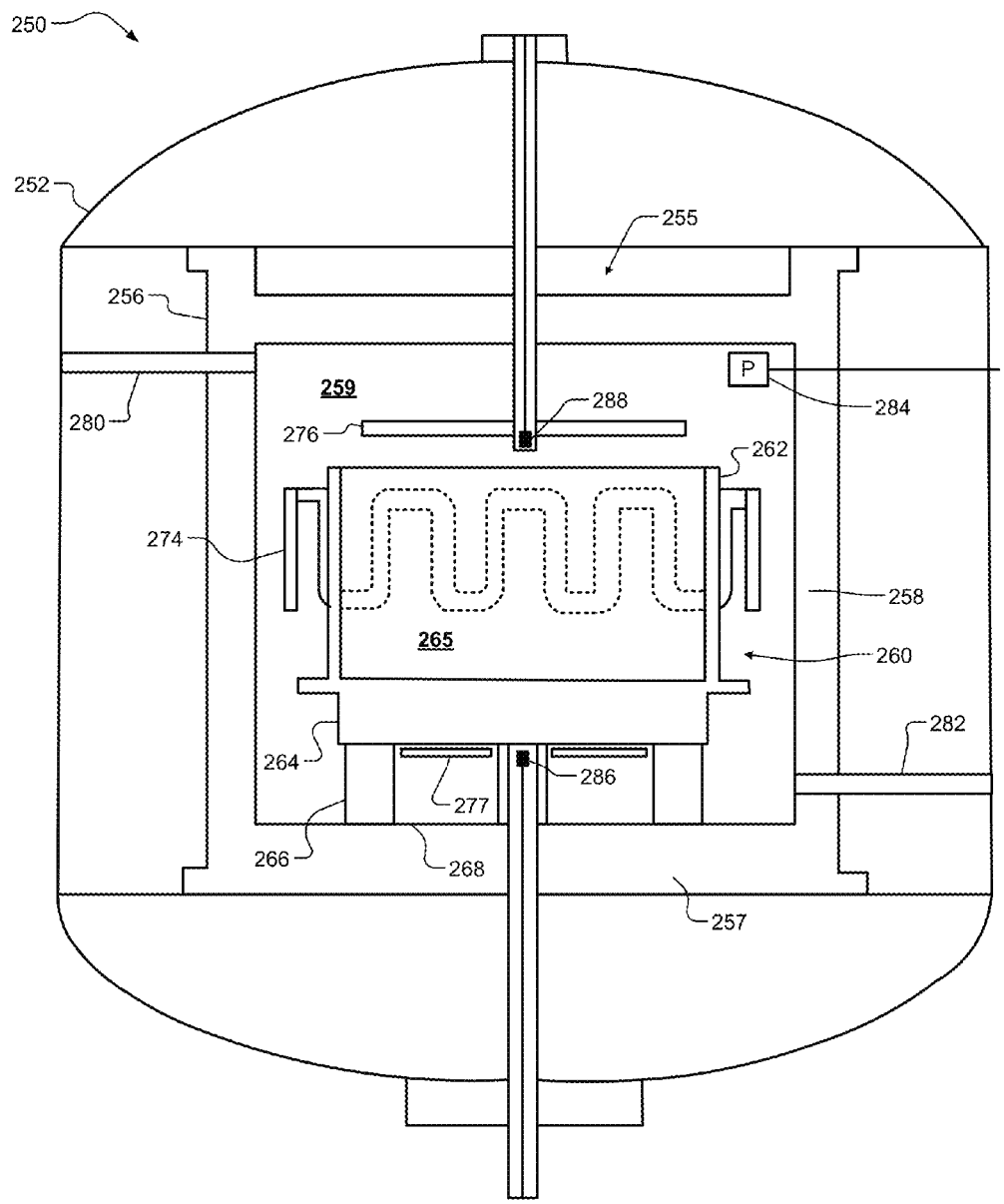
FIG. 8 is a functional block diagram of an example of a furnace.

Referring now to FIG. 8, an example of a furnace 250 is shown. While a specific type of furnace is shown, other types of furnaces can be used. Additional details relating to suitable furnaces can be found in commonly-assigned U.S. patent application Ser. No. 15/207,933, filed on Jul. 12, 2016 and entitled "Methods for Directly Bonding Silicon to Silicon or Silicon Carbide to Silicon Carbide", which is hereby incorporated by reference in its entirety.

The furnace 250 includes a housing 252. A thermal insulating structure 256 is arranged inside of the housing 252. The thermal insulating structure 256 includes a bottom portion 257 and one or more side walls 258 that define an inner cavity 259. A top portion 255 may be removable and/or include an opening (not shown).

A susceptor 260 is arranged in the inner cavity 259 of the thermal insulating structure 256. The susceptor 260 includes a bottom portion 261 and one or more side walls 262 that define an inner cavity 265 to receive parts to be bonded. In some examples, the susceptor 260 is made of graphite and has a cylindrical or cubicle cross-section, although other materials and/or cross-sections may be used. One or more supports 266 may be attached to or extend from the susceptor 260 to a bottom surface 268 of the inner cavity 259 of the thermal insulating structure 256. The supports 266 locate the susceptor 260 in a position that is spaced from the bottom surface 268.

One or more heaters 274 may be arranged around an outer periphery of the side walls 262 of the susceptor 260. The heater 274 may be spaced by a predetermined gap from the susceptor 260. Likewise, a heater 276 may be arranged a predetermined distance above a top surface of the susceptor 260. Additional heaters 277 may be arranged adjacent to the bottom surface of the susceptor 260. In some examples, the heaters 274, 276 and/or 277 may have linear, spiral, coiled, or "S"-shaped configurations, although other configurations may be used.

Gas may be supplied to the inner cavity 259 of the thermal insulating structure 256 by a gas inlet 280. Gas and other reactants may be evacuated from the inner cavity 259 of the thermal insulating structure 256 by a gas outlet 282. In some examples, an inert gas such argon (Ar), helium (He) or molecular nitrogen ($N_2$) or their forming gas such as Ar/$H_2$, $N_2$/$H_2$, may be supplied to the inner cavity 259 of the thermal insulating structure 256 during the bonding process. A pressure sensor 284 may be arranged in the inner cavity 259 to measure pressure in the inner cavity 259. Thermocouples 286 and 288 may be used to sense one or more temperatures in the inner cavity 259 of the thermal insulating structure 256.

Figure 9:
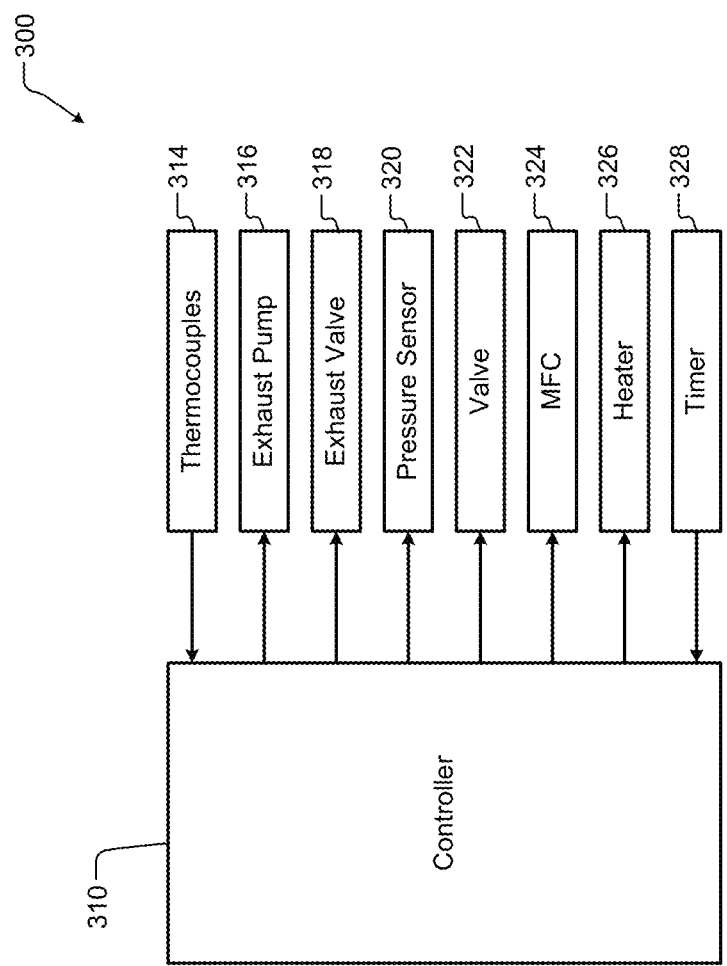
FIG. 9 is a functional block diagram of an example of a controller for controlling the furnace.

Referring now to FIG. 9, a control system 300 may be used to control operation of the furnace 250 during bonding of parts. The control system 300 includes a controller 310 that communicates with thermocouples 314 (such as thermocouples 286 and 288) to monitor temperatures within the inner cavity 259. The controller 310 may also communicate with an exhaust pump 316 and an exhaust valve 318 to create vacuum pressure and/or to evacuate the inner cavity 259.

The controller 310 may communicate with a pressure sensor 320 to control pressure inside of the inner cavity 259. Inert gas may be supplied to the inner cavity 259 of the thermal insulating structure 256 using one or more valves 322 and one or more mass flow controllers (MFCs) 324. The controller 310 may communicate with one or more heaters 126 (such as the heaters 274 and 276 in FIG. 5) to control the temperature in the furnace 250 during bonding. The controller 310 may communicate with an internal timer (not shown) or an external timer 328 to determine the predetermined bonding period.

In some examples, an Al—Si alloy bond with a silicon concentration of ~67% was formed at 1200° C. by heating in the furnace for 90 min followed by solidification in vacuum at a cool down rate of 1° C./min until 400° C. The external compressive force was 0.5 psi.

In another example, an Al—Si alloy bond with a silicon concentration of ~67% was formed at 1200° C. by heating in the furnace for 90 min followed by solidification in vacuum with a cool down profile as shown in FIG. 3, which was over 11° C./min from 1200° C. to 800° C., and 6.7° C./min on average from 800° C. to 400° C. The external compressive force was 1.5 psi.

In another example, Al—Si alloy bond with a silicon concentration of ~55% was formed by heating in a furnace at 1100° C. for 125min followed by solidification in vacuum at a cool down rate of 1° C./min until 500° C. In another example, Al—Si alloy bond with a silicon concentration of ~45% was formed by heating in a furnace at 1000° C. for 90 min followed by solidification in vacuum at a cool down rate of 2° C./min until 400° C. Bond micro-cracks were eliminated and wettability were significantly improved. In other examples, one or more linear or curved cool-down rates between 1° C./min and 20° C./min are used from the bonding temperature to another temperature (such as 400° C. for Al—Si). In other examples, one or more linear or curved temperature ramp-up rates between 2° C./min and 20° C./min are used during heating to the pre-determined temperatures.

In still other examples, pure Au or Au—Si alloy can be used as a filler material. In this example, an Au—Si bond is formed with Si concentration between 6%-30% (weight) by heating to temperatures between 700° C. and 1300° C. for period between 30 min and 300 min followed by solidification. Solidification can be performed using one or more linear or curved cool down rates between 1° C./min and 20° C./min from the bonding temperatures to another temperature (such as a temperature below the eutectic temperature). For example, the bonded part can be cooled to 200° C. In addition, one or more linear or curved temperature ramp-up rates between 2° C./min and 20° C./min can be used with or without intervening soaking periods before reaching the pre-determined temperature.

The methods described herein can be used to bond parts made of other semiconductor materials such as germanium (Ge). In this case, the bond is formed using a bonding temperature between 700° C. and 850° C. for period between 30 min to 300 min. Solidification can be performed at one or more linear or curved cool-down rates between 1° C./min and 20° C./min from the bonding temperature to 200° C. In addition, one or more linear or curved temperature ramp-up rates between 2° C./min and 20° C./min can be used either with or without intervening soaking periods before reaching the bonding temperature. In some examples, the soaking periods are in a range from 15 seconds to 5 minutes.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. The electronics may be referred to as the "controller," which may control various parts or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, etc.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system.

What is claimed is:

1. A bonded component, comprising:
first and second parts made of a first material selected from a group consisting of silicon and germanium; and
a bonding layer including:

a first buffer layer arranged adjacent to the first part;
a eutectic layer that is arranged adjacent to the first buffer layer; and
a second buffer layer arranged adjacent to the eutectic layer and the second part,
wherein the bonding layer includes a second material that is different than the first material and wherein the first buffer layer and the second buffer layer have a higher concentration of the first material than the eutectic layer.

2. The bonded component of claim 1, wherein a concentration by weight of the first material in the first buffer layer decreases as a distance from an interface between the first buffer layer and the first part increases in a direction towards the eutectic layer.

3. The bonded component of claim 1, wherein the first material includes germanium and the bonding layer includes germanium and aluminum.

4. The bonded component of claim 1, wherein the first material includes silicon and the bonding layer includes silicon and a material selected from a group consisting of aluminum and gold.

5. The bonded component of claim 1, wherein the first buffer layer and the second buffer layer have a first coefficient of thermal expansion (CTE) value that is between a second CTE value of the first part and the second part and a third CTE value of the eutectic layer.

6. The bonded component of claim 1, wherein a first weight percentage of the second material in the first and second buffer layers is less than one-half of a second weight percentage of the second material in the eutectic layer.

7. The bonded component of claim 4, wherein a weight percentage of aluminum in the first and second buffer layers is <0.01% (by weight) at interfaces between first and second buffer layers and the first and second parts, respectively, and in a range from 80% to 90% (by weight) at interfaces between first and second buffer layers and the eutectic layer.

8. A method for bonding the first part to the second part of the bonded component of claim 1, the method comprising:
providing the first part, the second part and a bonding material for the bonding layer between the first part and the second part;
arranging the first part, the bonding material, and the second part in a furnace; and
creating a bonded part by heating the first part, the second part and the bonding material to a predetermined temperature for a predetermined period,
wherein the predetermined period is followed by a predetermined solidification period,
wherein the predetermined temperature is greater than 1.5 times a eutectic temperature of an alloy including the first material and the second material and less than a melting temperature of the first material,
wherein the predetermined temperature, the eutectic temperature, and the melting temperature are in Celsius, and
wherein the bonded part includes the bonding layer.

9. The method of claim 8, wherein the first material includes silicon and the bonding material is selected from a group consisting of aluminum, aluminum-silicon alloy, gold, and gold-silicon alloy.

10. The method of claim 8, wherein the first material includes germanium and the bonding material is selected from a group consisting of aluminum and aluminum-germanium alloy.

11. The method of claim 8, wherein the first buffer layer and the second buffer layer have a first coefficient of thermal expansion (CTE) value that is between a second CTE value of the first part and the second part and a third CTE value of the eutectic layer.

12. The method of claim 8, wherein a first weight percentage of the second material in the first and second buffer layers is less than one-half of a second weight percentage of the second material in the eutectic layer.

13. The method of claim 9, wherein a weight percentage of aluminum in the first and second buffer layers is <0.01% (by weight) at interfaces between first and second buffer layers and the first and second parts, respectively, and in a range from 80% to 90% (by weight) at interfaces between first and second buffer layers and the eutectic layer.

14. The method of claim 8, further comprising cooling the bonded part during the predetermined solidification period at one or more predetermined cooling rates to a temperature less than the eutectic temperature.

15. The method of claim 8, further comprising heating the first part, the second part and the bonding material at one or more predetermined heating rates over one or more predetermined periods, respectively.

16. The method of claim 8, further comprising controlling a pressure of the furnace to a predetermined pressure, wherein the predetermined pressure is less than 1 Torr.

17. The method of claim 8, further comprising pressing the first part, the second part and the bonding material together during bonding using an external compressive force in a range from 0 psi to 5 psi.

18. The method of claim 8, wherein the predetermined period at the predetermined temperature is in a range from 30 minutes to 300 minutes.

19. The method of claim 9, wherein the bonding layer has a Si concentration in a range from 45 to 80% by weight.

20. The method of claim 8, wherein the eutectic layer has a thickness in a range from 5 to 30 micrometers.

* * * * *